US006902851B1

(12) United States Patent
Babcock et al.

(10) Patent No.: US 6,902,851 B1
(45) Date of Patent: Jun. 7, 2005

(54) METHOD FOR USING PHASE-SHIFTING MASK

(75) Inventors: Carl P. Babcock, Campbell, CA (US); Kouros Ghandehari, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 142 days.

(21) Appl. No.: 10/047,610

(22) Filed: Jan. 16, 2002

Related U.S. Application Data

(60) Provisional application No. 60/275,747, filed on Mar. 14, 2001.

(51) Int. Cl.$^7$ .............................. G03F 9/00; G03C 5/00

(52) U.S. Cl. ........................................ 430/5; 430/394

(58) Field of Search ............................ 430/5, 322, 323, 430/324, 394

(56) References Cited

U.S. PATENT DOCUMENTS

| | | | |
|---|---|---|---|
| 5,536,602 A | | 7/1996 | Nakao |
| 5,549,995 A | * | 8/1996 | Tanaka et al. ................. 430/5 |
| 5,563,012 A | | 10/1996 | Neisser |
| 5,614,335 A | | 3/1997 | Hashimoto et al. |
| 5,700,605 A | * | 12/1997 | Ito et al. ........................ 430/5 |
| 5,876,878 A | | 3/1999 | Pierrat et al. |
| 6,068,951 A | * | 5/2000 | Pierrat et al. ................. 430/5 |
| 6,320,648 B1 | | 11/2001 | Brueck et al. |
| 6,327,022 B1 | | 12/2001 | Nishi |
| 6,368,754 B1 | | 4/2002 | Imai |
| 6,593,039 B1 | * | 7/2003 | Kim ............................... 430/5 |
| 2002/0094482 A1 | | 7/2002 | Mansfield et al. |

OTHER PUBLICATIONS

United States Patent and Trademark Office Board of Patent Appeals and Interferences Decision on Appeal Mailed Sep. 20, 2004 in Reference to U.S. Appl. No. 09/844,014, 8 pages.

Reply Brief Under 37 C.F.R. § 1.193(b)(1) in Response to the Mar. 24, 2004 Examiner's Answer to the Appellant's Appeal Brief Mailed May 24, 2004 in Reference to U.S. Appl. No. 09/844,014, 9 pages.

United States Patent and Trademark Office Board of Patent Appeals and Interferences Examiner's Answer to the Appellant's Appeal Brief Filed Jan. 12, 2004, Mailed Mar. 24, 2004 In Reference to U.S. Appl. No. 09/844,014, 22 pages.

Brief on Appeal in Response to the Final Office Action Dated Aug. 13, 2003, Mailed Jan. 12, 2004, In Reference U.S. Appl. No. 09/844,014, 20 pages.

Amendment and Reply Under 37 C.F.R. 1.116 in Response to the Final Office Action Dated Aug. 13, 2003, Mailed Jan. 12, 2004, In Reference to U.S. Appl. No. 09/844,014, 6 pages.

Final Office Action in Response to Communication Filed on May 20, 2003, Mailed Aug. 13, 2003, In Reference to U.S. Appl. No. 09/844,014, 12 pages.

Amendment in Response to Office Action dated Feb. 21, 2003 In Reference to U.S. Appl. No. 09/844,014, Mailed May 20, 2003, 8 pages.

(Continued)

*Primary Examiner*—S. Rosasco
(74) *Attorney, Agent, or Firm*—Foley & Lardner LLP

(57) ABSTRACT

A phase-shifting mask for a photolithographic process includes a transparent material having first and second trenches. The first trench has a first depth and the second trench has a second depth deeper than the first depth. The phase-shifting mask is suitable for testing the effect of lights of two wavelengths on a layer of photoresist.

23 Claims, 3 Drawing Sheets

OTHER PUBLICATIONS

Office Action in Response to Communication Filed on Jan. 23, 2003, In Reference to U.S. Appl. No. 09/844,014, Mailed Feb. 21, 2003, 12 pages.

Response to Office Action dated Nov. 27, 2002, In Reference to U.S. Appl. No. 09/844,014, Mailed Jan. 23, 2003, 11 pages.

Final Office Action in Response to Communication Filed on Sep. 9, 2002, in Reference to U.S. Appl. No. 09/844,014, Mailed Nov. 27, 2002, 8 pages.

Amendment in Response to Office Action dated Jul. 22, 2002, In Reference to U.S. Appl. No. 09/844/014, Mailed Sep. 3, 2002, 14 pages.

Douglas Van Den Broeke, Transferring Phase–Shifting Mask Technology into Mainstream Manufacturing, printed from Internet address: http://www.semiconductorfabtech.com/f . . . s/lithography/articles/body5.225php3 on Oct. 6, 2002, 7 pages.

Andrew B. Kahng et al., Subwavelength Lithography and its Potential Impact on Design and EDA, 6 pages.

* cited by examiner

METHOD FOR USING PHASE-SHIFTING MASK

CROSS-REFERENCE TO RELATED APPLICATIONS

This application claims the benefit of U.S. Provisional Application No. 60/275,747, filed Mar. 14, 2001.

FIELD OF THE INVENTION

The present specification relates generally to fabrication processes for integrated circuits (ICs). More specifically, the present specification relates to an improved phase-shifting mask for transmitting light to a photoresist.

BACKGROUND OF THE INVENTION

The semiconductor or IC industry desires to manufacture integrated circuits (ICs) with higher and higher densities of devices on a smaller chip area to achieve greater functionality and to reduce manufacturing costs. This desire for large scale integration has led to a continued shrinking of the circuit dimensions and features of the devices.

The ability to reduce the size of structures such as shorter gate lengths in field-effect transistors is driven by lithographic technology which is, in turn, dependent upon the wavelength of light used to expose the photoresist. In current commercial fabrication processes, optical devices expose the photoresist using light having a wavelength of 248 nm (nanometers). Research and development laboratories are experimenting with the 193 nm wavelength to reduce the size of structures. Further, advanced lithographic technologies are being developed that utilize radiation having a wavelength of 157 nm and even shorter wavelengths, such as those used in Extreme Ultra-Violet (EUV) lithography (e.g., 13 nm).

Phase-shifting mask technology has been used to improve the resolution and depth of focus of the photolithographic process. Phase-shifting mask technology refers to a photolithographic mask which selectively alters the phase of the light passing through certain areas of the mask to take advantage of destructive interference to improve resolution and depth of focus. For example, in a simple case, each aperture in the phase-shifting mask transmits light 180 degrees out of phase from light passing through adjacent apertures. This causes any light overlapping from two adjacent apertures to interfere destructively, thereby reducing any exposure in the center "dark" area beneath an opaque layer, such as chrome.

An exemplary phase-shifting mask 10 is illustrated in FIG. 1. Phase-shifting mask 10 includes a transparent layer 12 and an opaque layer 14. Opaque layer 14 provides a printed circuit pattern to selectively block the transmission of light from transparent layer 12 to a layer of photoresist on a semiconductor wafer. Transparent layer 12 includes trenches 16 which are etched a predetermined depth into transparent layer 12. The light transmitted through transparent layer 12 at trenches 16 is phase-shifted 180 degrees from the transmission of light through other portions of phase-shifting mask 10, such as portions 18. As the light travels between phase-shifting mask 10 and the resist layer of a semiconductor wafer below (not shown), the light scattered from phase-shifting mask 10 at trenches 16 interferes destructively with the light scattered from phase-shifting mask 10 at portions 18, to provide improved resolution and depth of focus.

As mentioned, various different wavelengths of light are used in different photolithographic processes. The optimal wavelength of light is based on many factors, such as the composition of the resist, the desired critical dimension (CD) of the integrated circuit, etc. Often times the optimal wavelength of light must be determined by performing a lithography test with photolithographic equipment having different wavelengths. When a phase-shifting mask technique is utilized, two different phase-shifting masks must be fabricated, each mask having trenches 16 suitable for phase-shifting light of the desired wavelength. The fabrication of phase-shifting masks is costly. Further, comparison of the effect of the two printing processes at the different wavelengths is difficult. Differences in manufacturing biases or offsets between different phase-shifting masks further complicates comparison of the effects of the two printing processes.

Accordingly, an improved phase-shifting mask and method of testing photolithographic equipment is needed. Further, there is a need for reducing or eliminating the cost of fabricating multiple phase-shifting masks for multiple wavelengths of light. Further still, there is a need for a method of manufacturing a phase-shifting mask suitable for testing photolithographic processes. Further still, there is a need for reducing the cost and manufacturing biases or offsets associated with fabricating multiple phase-shifting masks. The teachings hereinbelow extend to those embodiments which fall within the scope of the appended claims, regardless of whether they accomplish one or more of the above mentioned needs.

SUMMARY OF THE INVENTION

According to one exemplary embodiment, a phase-shifting mask for a photolithographic process comprises a transparent material having first and second trenches. The first trench has a first depth and the second trench has a second depth deeper than the first depth.

According to another exemplary embodiment, a phase-shifting mask for a photolithographic process is manufactured by providing a transparent material, patterning a first plurality of trenches in the transparent material, the first plurality of trenches having a first depth. The process further comprises providing a resist layer over a portion of the transparent material and patterning a second plurality of trenches in the transparent material. The second plurality of trenches have a second depth deeper than the first depth.

According to yet another exemplary embodiment, a method of testing the effect of lights having different wavelengths on a layer of photoresist comprises providing a phase-shifting mask having a transparent material having first and second trenches, the first trench having a first depth and the second trench having a second depth deeper than the first depth. The method further comprises transmitting light having a first wavelength through the first trench to the photoresist layer and transmitting light having a second wavelength longer than the first wavelength through the second trench to the photoresist layer. The method further comprises comparing the effect on the photoresist layer of the light having the first wavelength to the effect on the photoresist layer of the light having the second wavelength.

BRIEF DESCRIPTION OF THE DRAWINGS

The invention will become more fully understood from the following detailed description, taken in conjunction with the accompanying drawings, wherein like reference numerals refer to like parts, in which.

DETAILED DESCRIPTION OF EXEMPLARY EMBODIMENTS

Figure 1:
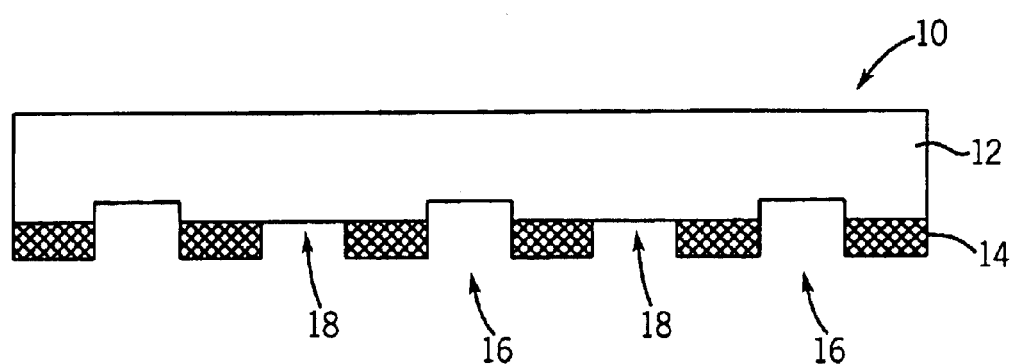
FIG. 1 is a schematic cross-sectional view of a phase-shifting mask according to the prior art.
Figure 2:
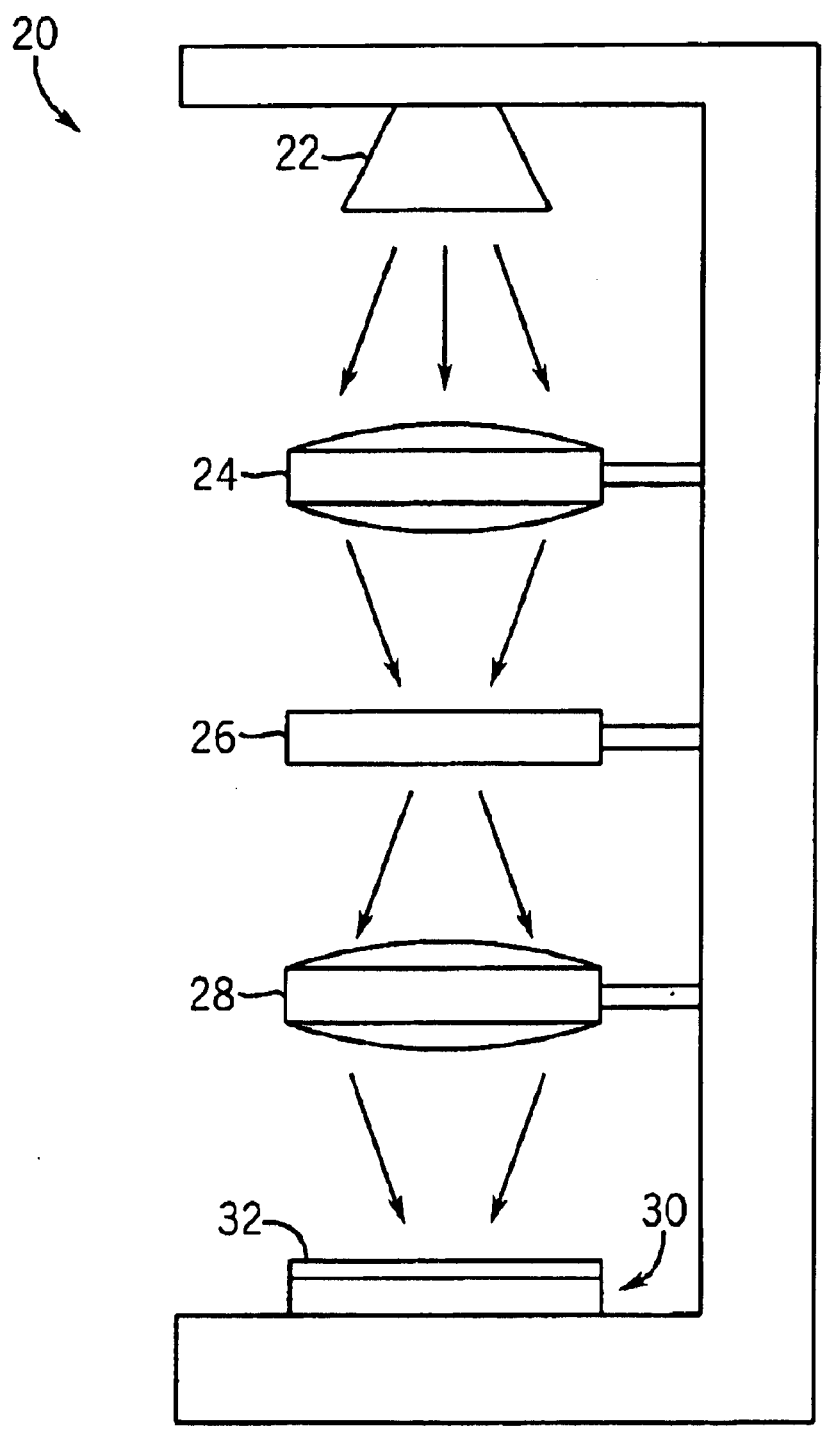
FIG. 2 is a schematic side view of a photolithography machine according to an exemplary embodiment.

Referring first to FIG. 2, a photolithography system or machine 20 is illustrated according to an exemplary embodiment. Photolithography machine 20 is a projection printing machine using refractive optics in a step-and-repeat projection method. Photolithography machine 20 is sometimes called a "stepper", which provides higher image resolution than other scanner-type aligners. Machine 20 may be any known photolithography machine, such as, a Canon E53 DUV scanner, manufactured by Canon Inc., Tokyo, Japan. Photolithography machine 20 may alternatively be other types of projection printing machines, such as 1:1 scanning projection aligners, and non-reduction step-and-repeat projection aligners (1× steppers), or may be other types of photolithography machines, such as proximity printing machines, or contact printing machines.

Photolithography machine 20 includes light source 22 configured to provide light at a plurality of wavelengths. For example, light source 22 may include an excimer laser, having a wavelength of 248 nm, 193 nm, and/or 157 nm. The excimer laser may use a KrF source, an ArF source, an $F_2$ source, etc. Advantageously, photolithography machine 20 includes at least two light sources, each having a different wavelength. Alternatively, photolithography machine 20 may have only one light source and the results of machine 20 may be compared to a second machine having a different light source. Photolithography machine 20 further includes a first lens 24, a mask 26, and a second lens 28. The light is provided from light source 22 through first lens 24, through mask 26, through second lens 28 to semiconductor wafer 30 having a layer of photoresist 32. Mask 26 is a phase-shifting mask in this exemplary embodiment, as will be described in greater detail below. Mask 26 includes a pattern for an integrated circuit or a portion thereof, which photolithography machine 20 uses in a step-and-repeat process to pattern an integrated circuit in photoresist 32. The exemplary structure illustrated in FIG. 2 is one of many suitable structures for photolithography machine 20, and other alternative configurations are contemplated.

Figure 3:
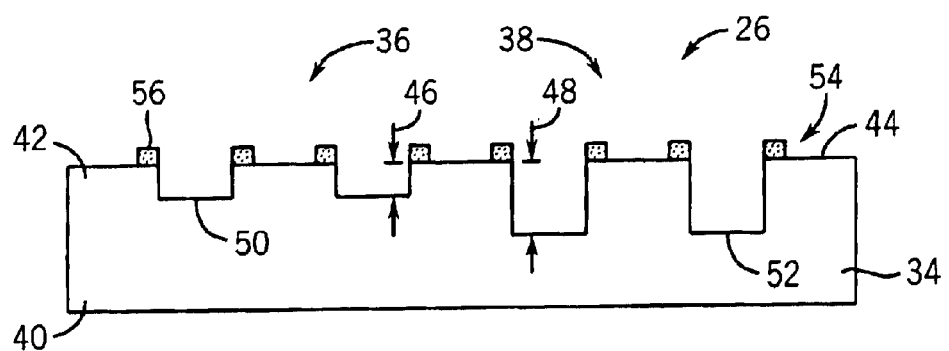
FIG. 3 is a schematic cross-sectional view of a phase-shifting mask according to an exemplary embodiment.

Referring now to FIG. 3, mask 26 is illustrated in an exemplary configuration. In FIG. 3, mask 26 is illustrated upside-down relative to its operational configuration as shown in FIG. 2. As situated in FIG. 3, mask 26 is shown in a manner suitable for fabrication of mask 26. Mask 26 includes a transparent layer 34 comprising any transparent material, such as, quartz, glass, fused silica, etc. Transparent layer 34 includes a first region of trenches 36 having a first depth. Mask 26 further includes a second region of trenches 38 having a second depth deeper than the first depth. The first depth is shallower than the second depth in this exemplary embodiment. The first depth is suitable for phase-shifting light received at a light-receiving side 40 of mask 26 and transmitted through a light-sending side 42 of mask 26. Preferably, the light is phase-shifted 180 degrees by layer 34.

The second depth is suitable for phase-shifting light having a second wavelength longer than the first wavelength which is received at light-receiving side 40 and transmitted through light-sending side 42. The depths in this exemplary embodiment are measured from a surface 44 of mask 26. The first depth is illustrated as first depth 46 and the second depth is illustrated as second depth 48.

The depths of the trenches within transparent layer 34 determine whether the trenches are suitable for phase-shifting light of a particular wavelength. For example, for a light having a wavelength of 193 nm, a depth of approximately 620 Angstroms is suitable. For a light of approximately 248 nm, a depth of approximately 795 Angstroms is suitable. In general, for a given wavelength λ and mask blank 34 index of refraction n(λ), the trench depth.

$$d = \frac{\lambda}{2n(\lambda)}.$$

Other particular configurations are contemplated. Further, a third region (not shown) having a third depth different than first and second depths 46, 48 may further be provided in mask 26 in addition to regions 36 and 38 to allow phase-shifting of light having a third wavelength. Any number of regions may be provided, each having a respective depth. In an exemplary embodiment, first region 36 and second region 38 each cover approximately one-half of mask 26. Thus, all phase-shifting trenches in first region 36, such as, trench 50 have first depth 46, and all phase-shifting trenches in second region 38, such as, trench 52, have second depth 48. Preferably, regions 36 and 38 cover at least one-quarter of the surface of one side of opaque layer 34.

Phase-shifting mask 26 may utilize any of a variety of phase-shifting mask technologies. In the exemplary embodiment illustrated in FIG. 3, an alternating aperture Levenson-type phase-shift mask technology is utilized. The exemplary technology utilized in the exemplary embodiment of FIG. 3 includes an opaque layer 54 (e.g., chrome, or other opaque material) patterned on surface 44 of mask 26 according to a desired printed circuit arrangement. Opaque layer 54 may be approximately 1,000 Angstroms thick, or may be between 500 and 1,500 Angstroms thick. Opaque layer 54 is fabricated selectively to leave light-blocking portions 56. Light-blocking portions 56 block the transmission of light through mask 26 to provide a printed circuit pattern onto a layer of photoresist.

Opaque layer 54 need not be present in all embodiments. For example, a chromeless phase-shifting mask may be used, wherein all of the dark regions cast upon the photoresist are created by destructive interference of the light as opposed to blocking the light with an opaque chrome pattern. Further, an alternating aperture phase-shift mask may be utilized in which each aperture in the opaque layer transmits light passing through in such a way that it would be 180 degrees out of phase from light passing through adjacent apertures. This would cause any overlapping light from two adjacent apertures to interfere destructively, thus reducing any scatter in the dark region. Further, a rim-shifting phase-shift mask may be utilized, in which each feature on the mask is circumscribed by a thin border where the light is transmitted 180 degrees out of phase to the primary feature. This places the two phases of light in close proximity so that destructive interference occurs at the edges of the features, thus gaining the advantages of resolution and depth of focus. Further yet, an embedded attenuating phase-shift mask may be utilized, in which the opaque material allows a small percentage of the light (e.g., 4–8%) at a given wavelength to be transmitted and, as a result of the light passing through the opaque material, the phase is changed by 180 degrees. Other phase-shifting mask technologies are contemplated.

Figure 4:
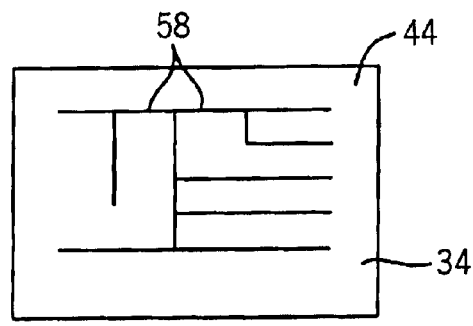
FIG. 4 is a schematic top view of the phase-shifting mask of FIG. 3, illustrating an etching step.
Figure 5:
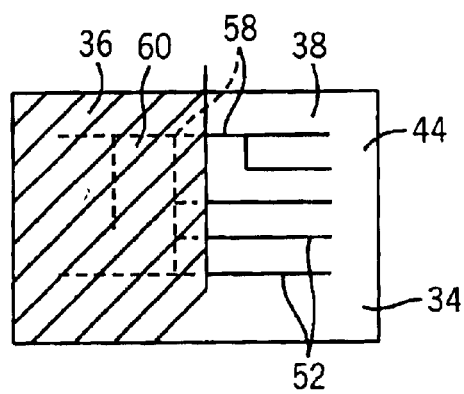
FIG. 5 is a schematic top view of the phase-shifting mask of FIG. 3, illustrating a photoresist apply step.
Figure 6:
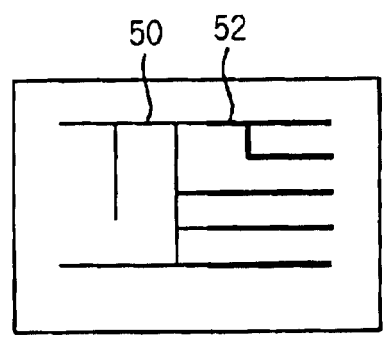
FIG. 6 is a schematic top view of the phase-shifting mask of FIG. 3, illustrating trenches having multiple depths.

Referring now to FIGS. 4–6, a method of manufacturing phase-shifting mask 26 will now be described. At FIG. 4, a top view of transparent layer 34 is shown. Trenches 58 are etched in layer 34 using a conventional mask and etch process. Namely, photoresist is applied to surface 44 of transparent layer 34. Next, an integrated circuit pattern is provided in the resist layer, which may be a positive or a negative resist layer. The resist layer can be patterned in a lithography process. The resist is developed, and trenches 58 are etched in transparent layer 34. Subsequently, the remaining resist is removed. Trenches 58 all have a first depth, such as depth 46, which is suitable to phase-shift light having a first wavelength by 180 degrees. According to one alternative embodiment, a chrome layer may also be patterned at this stage.

Referring now to FIG. 5, a resist layer is applied over a portion, e.g., approximately one-half, of surface 44 of transparent layer 34. Surface 44 has a surface area, and resist 60 is applied over approximately one-half of the surface area, thereby defining first region 36 and second region 38 (see FIG. 3). Alternatively, resist 60 may be provided over a smaller portion of surface 44. Advantageously, at least one-quarter of surface 44 is covered by resist 60. For example, resist 60 may be applied by spray coating with a cover over region 38 to prevent resist from resting on second region 38. Other resist application methods are contemplated.

Next, mask 26 is re-etched, whereby only second region 38 is etched in a fluorocarbon dry etch. Specifically, trenches 58 include a plurality of trenches 52 which are exposed during this second etch, trenches 52 being etched to a further depth during this second etch step. Trenches 52 are etched to increase the depth of the phase-shifting trenches to a depth suitable for phase-shifting of the longer wavelength. If a chrome layer is in place on surface 44, no further masking may be required, since the chrome layer will act as a hard mask. Alternatively, if no chrome is in place on second region 38, a second mask may further be required to perform the second etch step on trenches 52. This second mask would be patterned around trenches 52.

Referring now to FIG. 6, resist 60 is removed, leaving trenches 50 having a first depth suitable for phase-shifting light of a first wavelength, and trenches 52 having a second, deeper depth suitable for phase-shifting light having a second wavelength longer than the first wavelength. In FIG. 6, the first depth is illustrated schematically by a thin line and the second depth is illustrated schematically by a thicker line.

Referring again to FIG. 2, mask 26 is used for testing the effectiveness of different lights of photolithographic machine 20 on resist layer 32 of semiconductor wafer 30. Photolithography machine 20 provides a first light having a first wavelength through first trenches 50, whereby first trenches 50 (see FIG. 6) phase-shift this light before it reaches photoresist 32. Next, a second light having a second wavelength longer than the first wavelength is provided from light source 22 through trenches 52, which phase-shift the light before the light reaches photoresist 32. Both wavelengths of light have now provided a pattern in resist 32 of semiconductor wafer 30, which can be compared using conventional viewing systems e.g., a scanning electron microscope (SEM) to compare the effect on the photoresist layer 32 of the light having the first wavelength to the effect on the photoresist layer 32 of the light having a second wavelength.

Advantageously, one may utilize the mask and system shown herein for testing or research and development to compare the capabilities of the longer wavelength printing process versus the shorter wavelength printing process. Further, two masks need not be fabricated, which saves cost, materials, and time. Further still, a direct side-by-side comparison of the two different wavelength printing processes may be observed. Further yet, since a mask with dual wavelength capability has a section for each wavelength manufactured on the same substrate, the manufacturing offset or bias will be the same.

While the exemplary embodiments illustrated in the FIGS. and described above are presently preferred, it should be understood that these embodiments are offered by way of example only. For example, the materials, dimensions, sizes, and equipment mentioned herein is merely exemplary and may be substituted with other such elements in alternative arrangements. Further, while the phase-shifting mask is illustrated in a testing or research and development use, alternative uses may be found in manufacturing, production, or other applications. Accordingly, the present invention is not limited to a particular embodiment, but extends to various modifications that nevertheless fall within the scope of the appended claims.

What is claimed is:

1. A method of testing the effect of-lights having different wavelengths on a layer of photoresist, comprising:
   providing a phase-shifting mask having a transparent material having first and second trenches, the first trench having a first depth and the second trench having a second depth deeper than the first depth;
   transmitting light having a first wavelength through the first trench to the photoresist layer such that the light having a first wavelength is phase-shifted;
   transmitting light having a second wavelength longer than the first wavelength through the second trench to the photoresist layer such that the light having a second wavelength is phase-shifted; and
   comparing an effect on the photoresist layer of the light having the first wavelength to an effect on the photoresist layer of the light having the second wavelength.

2. The method of claim 1, wherein the first depth is suitable for phase-shifting light having the wavelength of 248 nm by 180 degrees.

3. The method of claim 1, wherein the first depth is suitable for phase-shifting the first light by 180 degrees and the second depth is suitable for phase-shifting the second light by 180 degrees.

4. The method of claim 1, wherein the first depth is suitable for phase-shifting light having a wavelength of 193 nm.

5. The method of claim 1, wherein the transparent material includes a first region of trenches including the first trench, the first region of trenches including a plurality of trenches having the first depth, wherein the transparent material includes a second region of trenches including the second trench, the second region of trenches including a plurality of trenches having the second depth.

6. The method of claim 5, wherein the first region comprises at least one-fourth of the transparent material and the second region comprises at least one-fourth of the transparent material.

7. The method of claim 5, wherein the first region comprises approximately one-half of the transparent material and the second region comprises approximately one-half of the transparent material.

8. The method of claim 1, wherein the phase-shifting mask includes an opaque layer coupled to the transparent material, the opaque layer representing a printed circuit pattern.

9. A method of using a phase-shifting mask comprising:
transmitting light having a first wavelength through a first set of trenches provided in a phase-shifting mask to a layer of material such that the light having a first wavelength is phase-shifted, the first set of trenches having a first depth;
transmitting light having a second wavelength longer than the first wavelength through a second set of trenches provided in the phase-shifting mask to the layer of material such that the light having a second wavelength is phase-shifted, the second set of trenches have a second depth greater than the first depth; and
comparing patterns provided in the layer of material by the light having the first wavelength and by the light having the second wavelength.

10. The method of claim 9, wherein the step of comparing patterns provided in the layer of material comprises utilizing a scanning electron microscope.

11. The method of claim 9, wherein the layer of material comprises a photoresist material.

12. The method of claim 9, wherein the first depth is suitable for phase-shifting light having a wavelength of 248 nm by 180 degrees.

13. The method of claim 9, wherein the first depth is suitable for phase-shifting the first light by 180 degrees and the second depth is suitable for phase-shifting the second light by 180 degrees.

14. The method of claim 9, wherein the first depth is suitable for phase-shifting light having a wavelength of 193 nm by 180 degrees.

15. The method of claim 9, wherein the phase-shifting mask comprises a transparent material and includes a first region including the first set of trenches and a second region including the second set of trenches.

16. The method of claim 15, wherein the first region comprises at least one-fourth of the phase-shifting mask and the second region comprises at least one-fourth of the phase-shifting mask.

17. The method of claim 15, wherein the first region comprises approximately one-half of the phase-shifting mask and the second region comprises approximately one-half of the phase-shifting mask.

18. The method of claim 15, wherein the phase-shifting mask includes an opaque layer coupled to the transparent material, the opaque layer representing a printed circuit pattern.

19. A method for using a phase-shifting mask to test the effects of light having different wavelengths comprising:
providing a phase-shifting mask comprising a transparent material, the phase shifting mask comprising a plurality of first trenches having a first depth and a plurality of second trenches have a second depth deeper than the first depth;
passing light having a first wavelength through the plurality of first trenches to a layer comprising photoresist material such that the light having a first wavelength is phase-shifted;
passing light having a second wavelength longer than the first wavelength through the plurality of second trenches to the layer comprising photoresist material such that the light having a second wavelength is phase-shifted;
analyzing the layer of photoresist material to determine the effects of the light having the first wavelength and of the light having the second wavelength.

20. The method of claim 19, wherein the phase-shifting mask includes a first area comprising the plurality of first trenches, the first area comprising at least one-fourth of the phase-shifting mask.

21. The method of claim 20, wherein the first area comprises at least one-half of the phase-shifting mask.

22. The method of claim 19, wherein the phase-shifting mask comprises an opaque layer provided over the transparent material.

23. The method of claim 19, wherein the first depth is suitable to phase-shift the light having a first wavelength by 180 degrees and the second depth is suitable to phase-shift the light having a second wavelength by 180 degrees.

* * * * *

UNITED STATES PATENT AND TRADEMARK OFFICE
CERTIFICATE OF CORRECTION

PATENT NO. : 6,902,851 B1
DATED : June 7, 2005
INVENTOR(S) : Carl P. Babcock and Kouros Ghandehari It is certified that error appears in the above-identified patent and that said Letters Patent is hereby corrected as shown below:

<u>Column 6,</u>
Line 25, delete "of-lights" and insert therefor -- of lights --.

Signed and Sealed this

Thirtieth Day of August, 2005

JON W. DUDAS
*Director of the United States Patent and Trademark Office*